(12) United States Patent
Vincent et al.

(10) Patent No.: US 11,961,776 B2
(45) Date of Patent: Apr. 16, 2024

(54) SEMICONDUCTOR DEVICE WITH CONNECTOR IN PACKAGE AND METHOD THEREFOR

(71) Applicant: NXP USA, INC., Austin, TX (US)

(72) Inventors: Michael B. Vincent, Chandler, AZ (US); Scott M. Hayes, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 204 days.

(21) Appl. No.: 17/456,910

(22) Filed: Nov. 30, 2021

(65) Prior Publication Data

US 2023/0170270 A1    Jun. 1, 2023

(51) Int. Cl.
  *H01L 23/58* (2006.01)
  *H01L 21/56* (2006.01)
  (Continued)

(52) U.S. Cl.
  CPC .......... *H01L 23/3128* (2013.01); *H01L 21/56* (2013.01); *H01L 24/08* (2013.01);
  (Continued)

(58) Field of Classification Search
  CPC ..... H01L 23/3128; H01L 21/56; H01L 24/08; H01L 2224/08225; H01L 2224/32225; H01L 24/19; H01L 21/568; H01L 2924/00014; H01L 2924/15311; H01L 2224/12105; H01L 2224/04105; H01L 23/49816; H01L 21/6835; H01L 23/5389; H01L 2924/00; H01L 24/73; H01L 21/561; H01L 25/50; H01L 2224/0401; H01L 2224/73204; H01L 24/96; H01L 2224/32145; H01L 24/81; H01L 21/4853; H01L 2225/1058; H01L 2221/68359; H01L 23/3114; H01L 2924/18161; H01L 2224/48227; H01L 21/4857; H01L 23/49827; H01L 2224/131; H01L 2224/16145; H01L 2225/06513; H01L 23/49822; H01L 21/78; H01L 25/0655; H01L 23/49811; H01L 2225/0651; H01L 2224/94; H01L 2924/18162; H01L 23/5385; H01L 2224/13111; H01L 2221/68372; H01L 2224/92125; H01L 24/17; H01L 2224/81005; H01L 2224/45099; H01L 23/3107; H01L 2924/01013; H01L 23/3135; H01L 2924/01047; H01L 2224/02379; H01L 2924/15192; H01L 2224/0231; H01L 2224/45015; H01L 24/29;
(Continued)

(56) References Cited

U.S. PATENT DOCUMENTS 9,230,875 B2    1/2016  Zhao et al.
10,529,670 B2   1/2020  Vincent et al.
(Continued)

*Primary Examiner* — Niki H Nguyen
(74) *Attorney, Agent, or Firm* — Robert J. Amedeo

(57) ABSTRACT

A method of forming a semiconductor device is provided. The method includes providing a connector structure configured for carrying a signal and providing a semiconductor die. At least a portion of the connector structure and the semiconductor die are encapsulated with an encapsulant. The semiconductor die is interconnected with the connector structure by way of a conductive trace.

17 Claims, 12 Drawing Sheets

(51) Int. Cl.
  *H01L 23/00*    (2006.01)
  *H01L 23/31*    (2006.01)
  *H01R 24/40*    (2011.01)
  *H01R 103/00*   (2006.01)

(52) U.S. Cl.
  CPC .... *H01R 24/40* (2013.01); *H01L 2224/08225* (2013.01); *H01R 2103/00* (2013.01)

(58) Field of Classification Search
  CPC . H01L 2924/01322; H01L 2224/81203; H01L 25/16; H01R 24/40; H01R 2103/00
  See application file for complete search history.

(56) References Cited

U.S. PATENT DOCUMENTS

| | | | |
|---|---|---|---|
| 2013/0105991 A1* | 5/2013 | Gan | H01L 24/19 |
| | | | 257/777 |
| 2013/0154091 A1 | 6/2013 | Wright et al. | |
| 2015/0262931 A1* | 9/2015 | Vincent | H01L 21/6836 |
| | | | 257/773 |
| 2019/0279950 A1* | 9/2019 | Kim | H01L 23/3114 |
| 2020/0251421 A1 | 8/2020 | Chen et al. | |
| 2021/0183796 A1 | 6/2021 | Vincent et al. | |

\* cited by examiner

SEMICONDUCTOR DEVICE WITH CONNECTOR IN PACKAGE AND METHOD THEREFOR

BACKGROUND

Field

This disclosure relates generally to semiconductor device packaging, and more specifically, to semiconductor devices having a connector in package and method of forming the same.

Related Art

Today, there is an increasing trend to include sophisticated semiconductor devices in products and systems that are used every day. These sophisticated semiconductor devices may include features for specific applications which may impact the size of the semiconductor device packages, for example. For some features and applications, the location of the semiconductor devices may be further restricted within a product or system. Accordingly, significant challenges exist in accommodating these features and applications while minimizing the impact on semiconductor devices size, location, and cost.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device having a connector in package. The semiconductor device includes a semiconductor die and one or more connector structures at least partially encapsulated with an encapsulant. Each of the one or more connector structures includes a signal member exposed through the encapsulant and configured for connection with a mating connector. An external antenna module or other accessories having corresponding mating connector(s) may be electrically connected to the semiconductor device by way of the one or more connector structures. By connecting an external antenna module in this manner, for example, the antenna can be formed in any size, shape, and orientation without impacting the physical dimensions and location of the semiconductor device.

Figure 1:
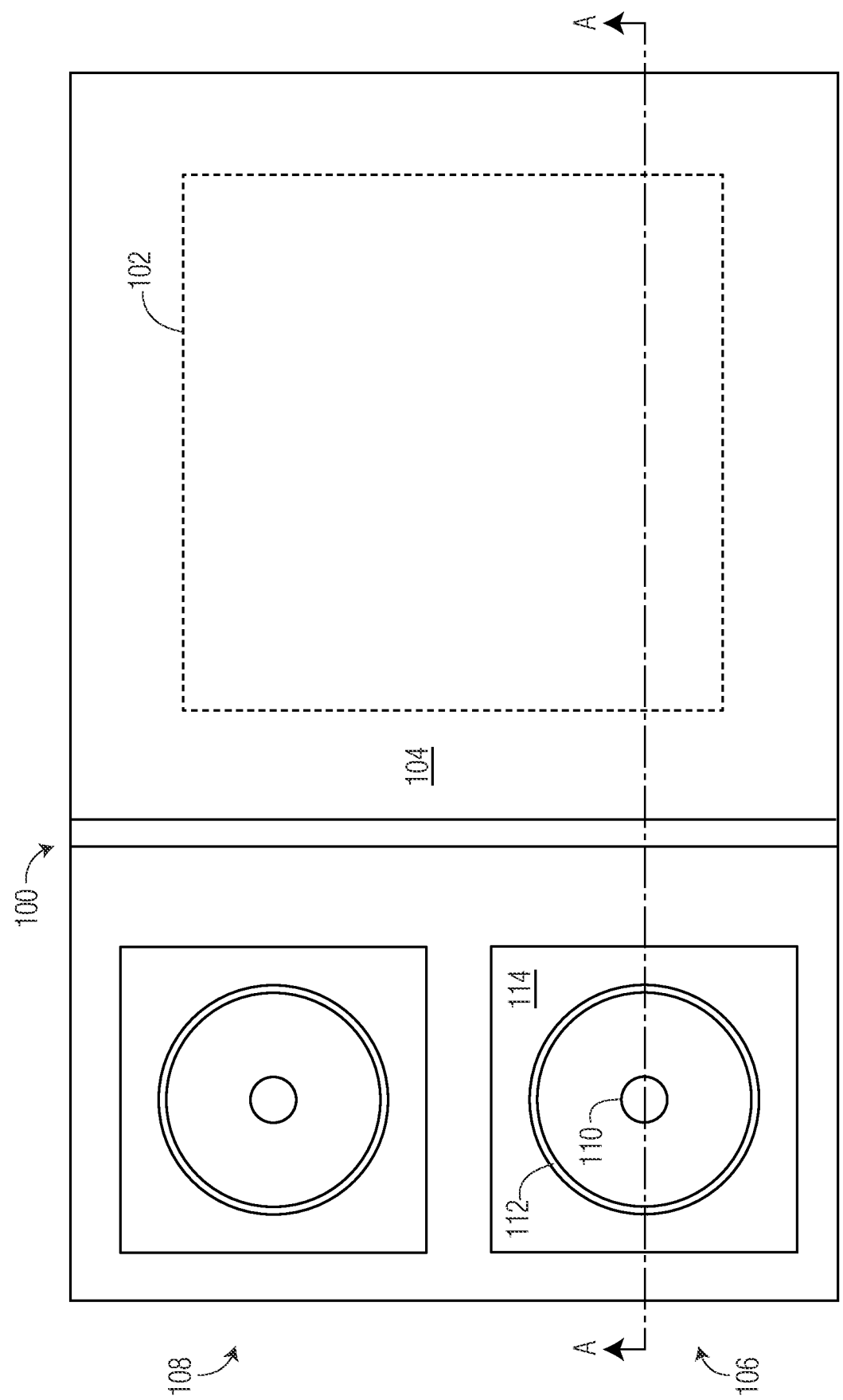
FIG. 1 illustrates, in a simplified top-side-up plan view, an example semiconductor device having a connector in package at a stage of manufacture in accordance with an embodiment.

FIG. 1 illustrates, in a simplified top-side-up plan view, an example semiconductor device 100 having a connector in package at a stage of manufacture in accordance with an embodiment. In this embodiment, the semiconductor device 100 includes a plurality of connector structures 106 and 108 and a semiconductor die 102 encapsulated with an encapsulant 104 (e.g., epoxy molding compound). The encapsulated semiconductor die 102 is shown as dashed outline for reference. Simplified cross-sectional views of the example semiconductor device 100 taken along line A-A at stages of manufacture are depicted in FIG. 2 and FIG. 3.

In this embodiment, each of the connector structures 106 and 108 include a base 114 partially encapsulated, and a conductive signal member 110 and a conductive shield member 112 exposed at a top surface of the base. Each of the connector structures 106 and 108 is configured for attachment of an antenna, antenna module, or antenna cable by way of the connector structures, for example. In some embodiments, the connector structure 106 may be characterized as a transmitter (TX) antenna connector and the connector structure 108 may be characterized as a receiver (RX) antenna connector. The number and arrangement of the connector structures in this embodiment are chosen for illustration purposes. In other embodiments, the semiconductor device 100 may include any number of the connector structures, arranged accordingly. In this embodiment, the connector structures 106 and 108 are configured for propagation of RF signals such as ultra-wideband (UWB) signals and other signals in a suitable frequency range. In some embodiments, the connector structures 106 and 108 may be configured for connection of external accessories or provide power supply connections for external accessories.

Figure 2:
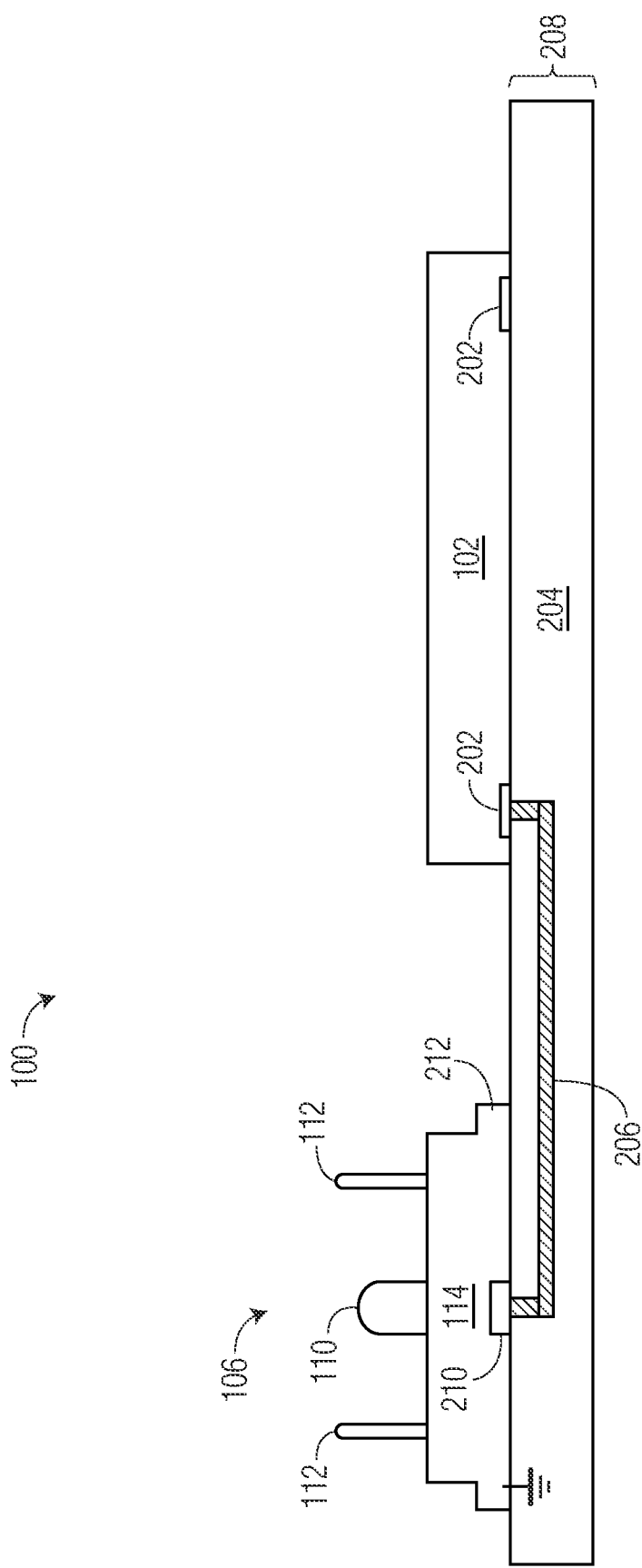
FIG. 2 and FIG. 3 illustrate, in simplified cross-sectional views, the example semiconductor device at stages of manufacture in accordance with an embodiment.
Figure 3:
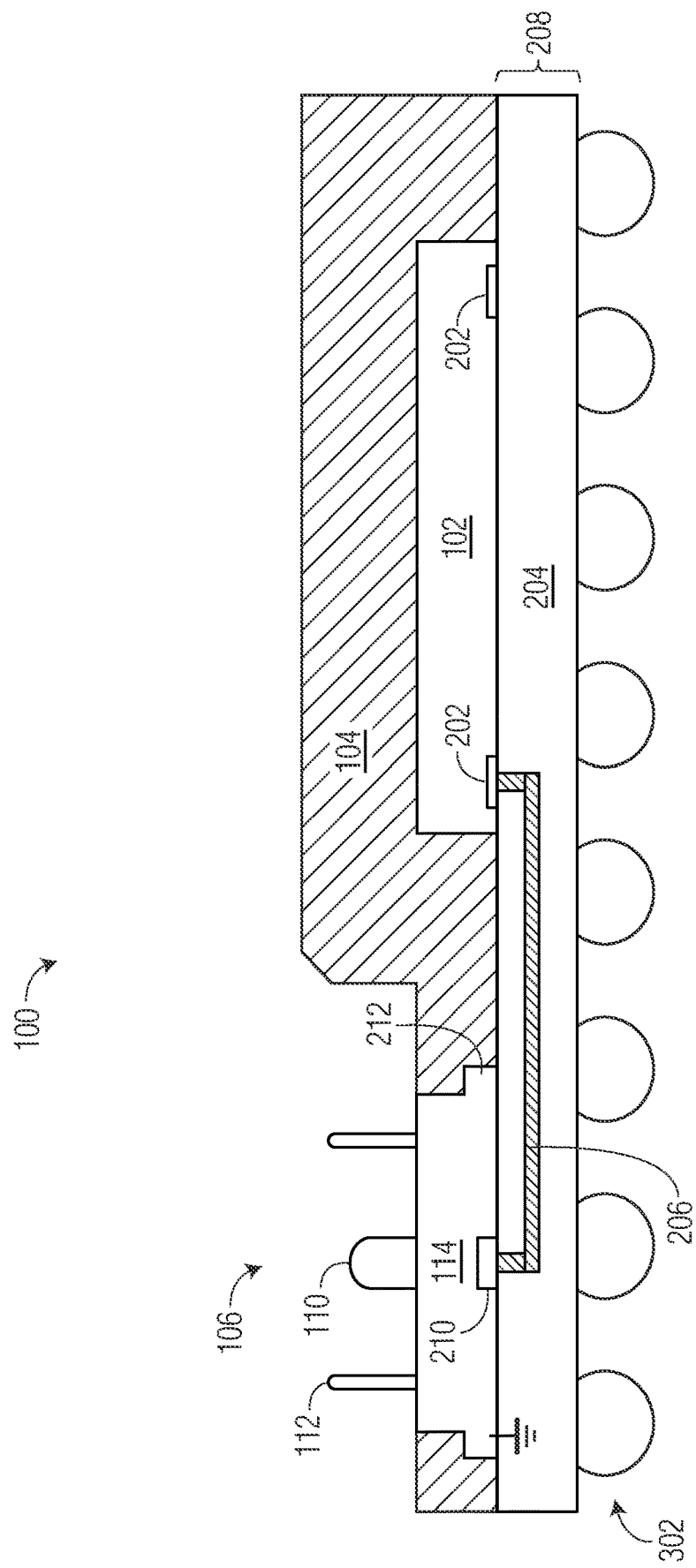

FIG. 2 illustrates, in a simplified cross-sectional view, the example semiconductor device 100 taken along line A-A at a stage of manufacture in accordance with an embodiment. At this stage, the semiconductor device 100 includes the semiconductor die 102 and the connector structure 106 affixed on a package substrate 208. The package substrate 208 includes conductive features (e.g., metal feed 206) surrounded by non-conductive material 204 (e.g., FR4). In this embodiment, the package substrate 208 is provided as a pre-formed substrate. Conductive feed 206 is formed in the package substrate 208 between bond pad 202 and signal terminal 210 to interconnect the semiconductor die 102 and the connector structure 106. A ground terminal of the base 114 of the connector structure 106 is interconnected to a ground voltage supply terminal (illustrated as a ground symbol) by way of the package substrate 208.

The semiconductor die 102 has an active side (e.g., major side having circuitry) and a backside (e.g., major side opposite of the active side). The semiconductor die 102 includes bond pads 202 formed at the active side. In this embodiment, the bond pad 202 shown is configured for connection to the connector structure 106 by way of interconnecting conductive feed 206, for example. In this embodiment, semiconductor die 102 is configured in an active-side-down orientation with the active side affixed on the package substrate 208. The semiconductor die 102 may be formed from any suitable semiconductor material, such as silicon, germanium, gallium arsenide, gallium nitride, and the like. The semiconductor die 102 further includes any digital circuits, analog circuits, RF circuits, memory, processor, the like, and combinations thereof at the active side.

The connector structure 106 includes the base 114, the conductive shield member 112 attached to the base, and the signal member 110 electrically isolated from the base portion and shield member. In this embodiment, the base 114 includes a flange portion 212 configured to enhance structural stability and reinforcement after encapsulation with the encapsulant 104. The flange 212 may include the ground terminal of the base 114 configured for connection to the ground voltage supply terminal. The connector base 114 is affixed on the package substrate 208 and interconnected by way of the conductive features of the package substrate 208. The base 114 may be attached to the package substrate using solder, conductive epoxy, conductive film, or the like. The conductive shield member 112 of the connector structure 106 substantially surrounds the signal member 110. Thus, the connector structure 106 may be characterized as a coaxial connector structure. In this embodiment, the connector structure 106 is configured for attachment of a mating connector (e.g., affixed to antenna, antenna module, antenna cable). For example, the connector structure 106 may be in the form of a plug with the mating connector in the form of a socket, or vice versa.

FIG. 3 illustrates, in a simplified cross-sectional view, the example semiconductor device 100 taken along line A-A at a subsequent stage of manufacture in accordance with an embodiment. At this stage, the semiconductor device 100 includes the semiconductor die 102 and the connector structure 106 at least partially encapsulated with the encapsulant 104 while affixed on the package substrate 208. In this embodiment, the semiconductor die 102 and base portion of the connector structure 106 is over-molded with the encapsulant 104 by way of a molding process such as film assisted molding (FAM) or other suitable molding process. In this embodiment, the encapsulant 104 is in direct contact with outer sidewalls of the connector base 114. In this embodiment, the encapsulant 104 overlaps the flange 212 of the connector base 114 to enhance structural stability and reinforcement of the connector structure 106.

After encapsulating with the encapsulant 104, conductive connectors 302 (e.g., solder balls) are affixed to a bottom surface of the package substrate 208. The conductive connectors 302 are configured and arranged to provide conductive connections between the semiconductor device 100 and a printed circuit board (PCB), for example. The conductive connectors 302 may be in the form of any suitable conductive structures such as solder balls, gold studs, copper pillars, and the like, to connect conductive features of the semiconductor device 100 with the PCB.

Figure 4:
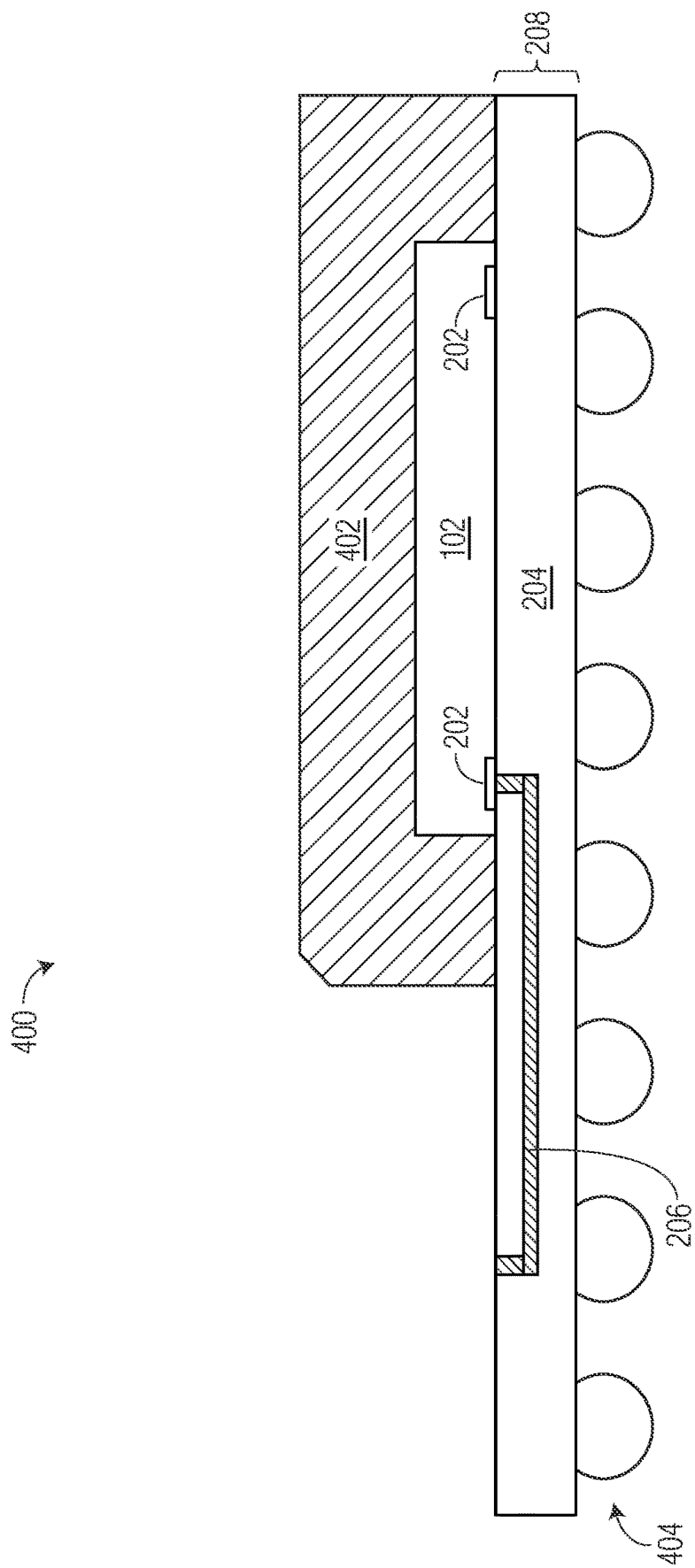
FIG. 4 through FIG. 6 illustrate, in simplified cross-sectional views, an alternative example semiconductor device having a connector in package at stages of manufacture in accordance with an embodiment.
Figure 5:
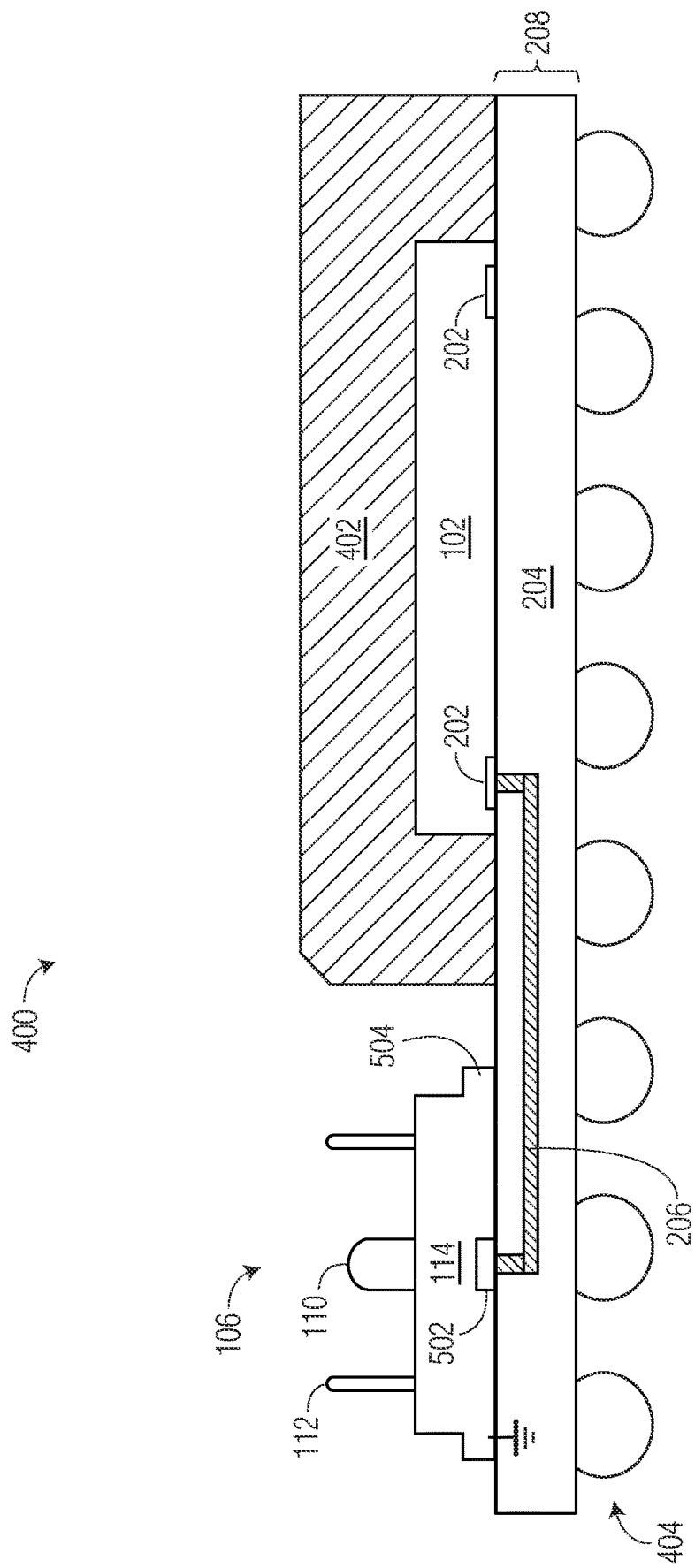
Figure 6:
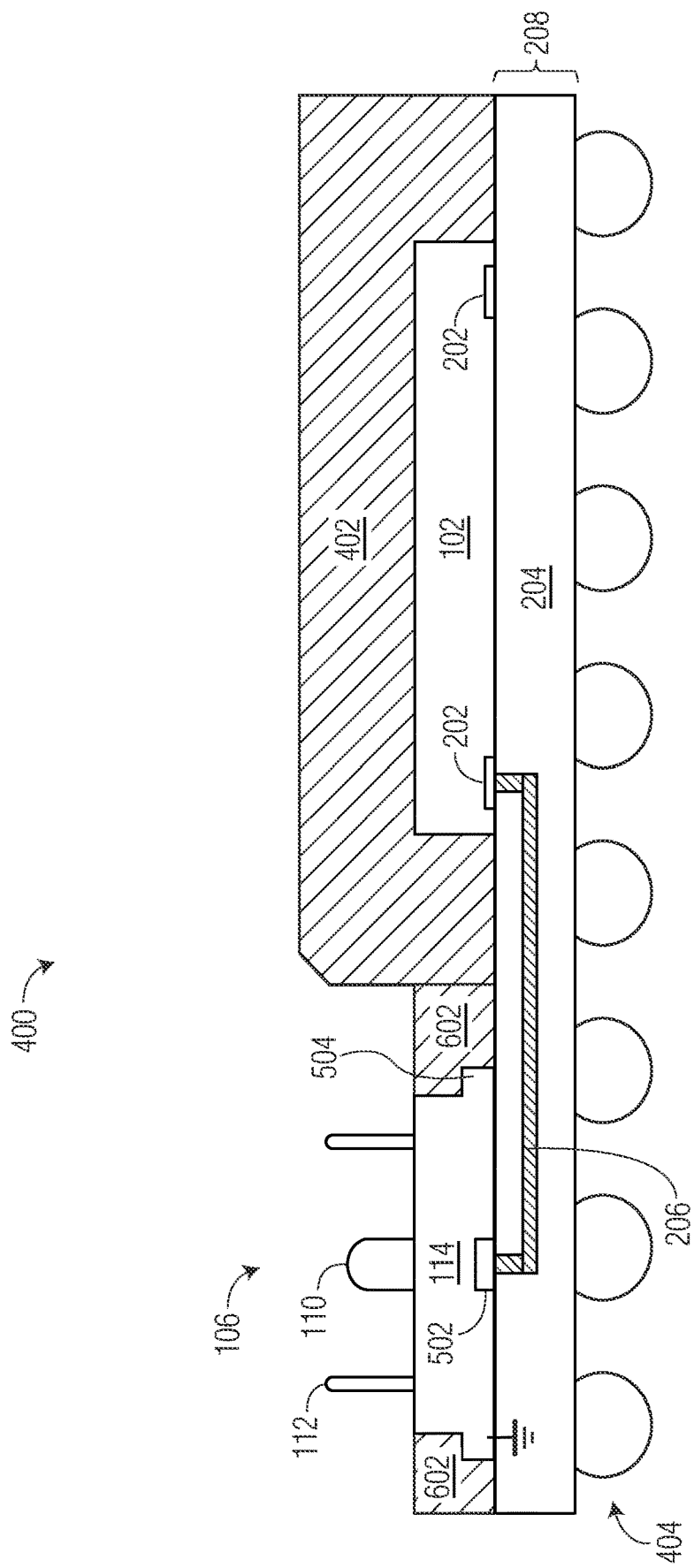

FIG. 4 illustrates, in a simplified cross-sectional view, an alternative example semiconductor device 400 at a stage of manufacture in accordance with an embodiment. The stages of manufacture depicted in FIG. 4 through FIG. 6 are alternatives to the stages of manufacture depicted in FIG. 2 and FIG. 3. In the embodiment depicted in FIG. 4 through FIG. 6, a two-step molding process is utilized in which the semiconductor die 102 is encapsulated in a process step different from that of the connector structure 106. At this stage, the semiconductor device 400 includes the semiconductor die 102 affixed on the package substrate 208 and encapsulated with an encapsulant 402. After encapsulating with the encapsulant 402, conductive connectors 404 are affixed to a bottom surface of the package substrate 208.

FIG. 5 illustrates, in a simplified cross-sectional view, the alternative example semiconductor device 400 at a subsequent stage of manufacture in accordance with an embodiment. At this stage, the semiconductor device 400 includes the connector structure 106 affixed on the package substrate 208 and interconnected with the semiconductor die 102 by way of the conductive feed 206. Conductive feed 206 is formed in the package substrate 208 between bond pad 202 and signal terminal 502 to interconnect the semiconductor die 102 and the connector structure 106. The ground terminal of the base 114 of the connector structure 106 is interconnected to a ground voltage supply terminal of the package substrate 208 as illustrated by the ground symbol. In this embodiment, the base 114 of the connector structure 106 includes a flange 504 configured to enhance structural stability and reinforcement after encapsulation with an encapsulant.

FIG. 6 illustrates, in a simplified cross-sectional view, the alternative example semiconductor device 400 at a subsequent stage of manufacture in accordance with an embodiment. At this stage, the semiconductor device 400 includes the connector structure 106 at least partially encapsulated with an encapsulant 602. In this embodiment, a base portion of the connector structure 106 is over-molded with the encapsulant 602 in a process step different from the encapsulation process step of the semiconductor die 102. In this embodiment, the encapsulant 602 abuts a sidewall of the encapsulant 402 and is in direct contact with outer sidewalls of the connector base 114. Because the encapsulant 602 overlaps the flange 504 of the connector base 114, structural stability and reinforcement of the connector structure 106 is enhanced in the semiconductor device 400.

Figure 7:
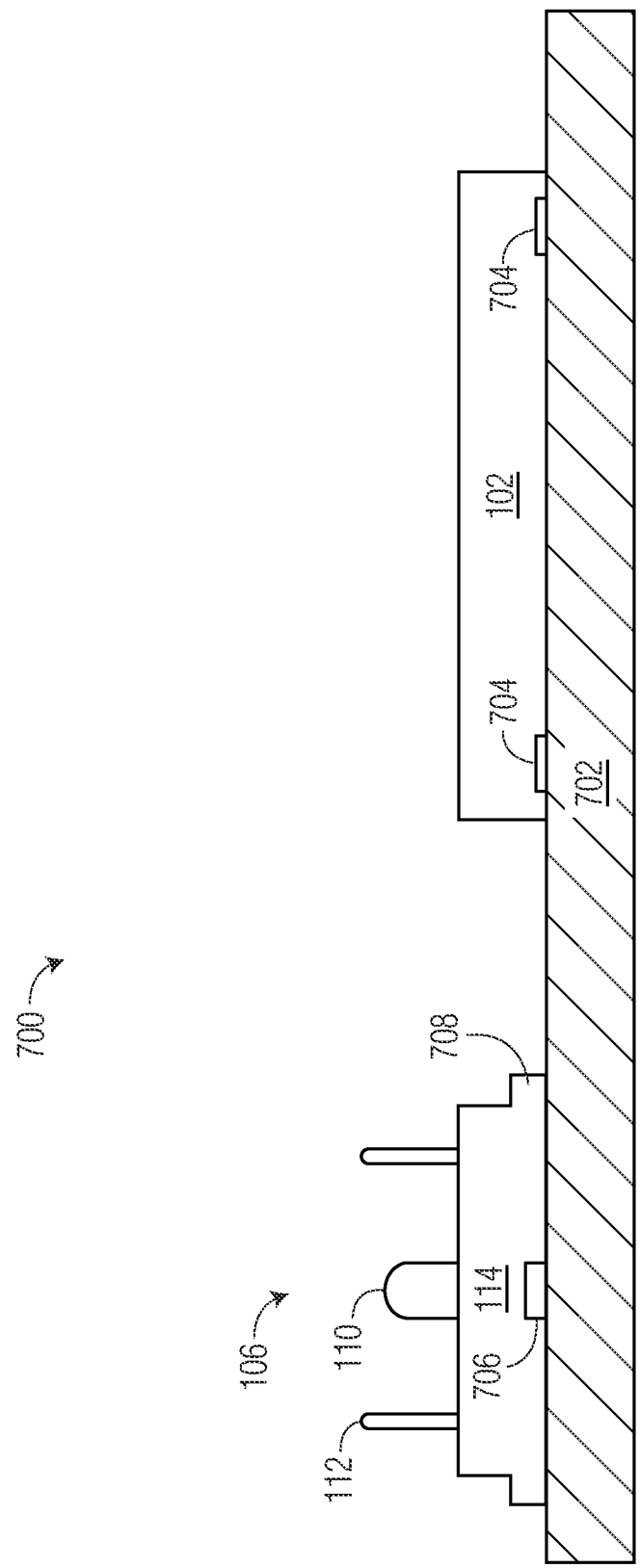
FIG. 7 through FIG. 9 illustrate, in simplified cross-sectional views, another alternative example semiconductor device having a connector in package at stages of manufacture in accordance with an embodiment.
Figure 8:
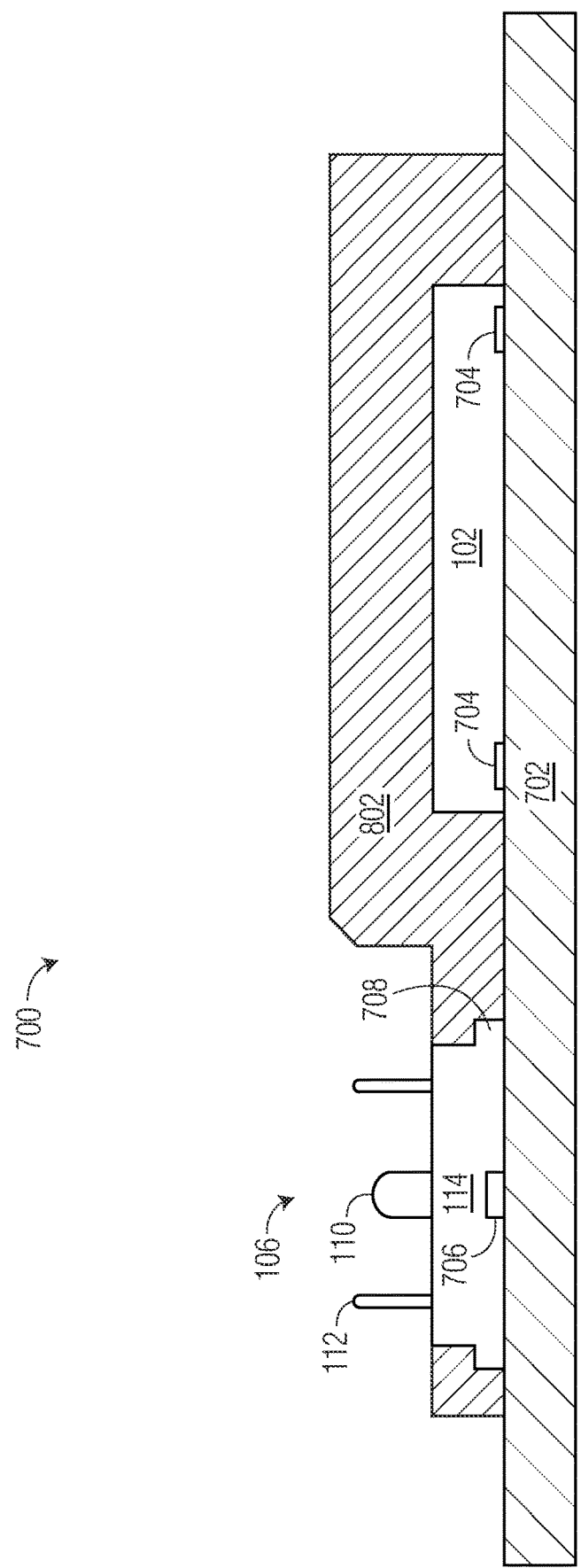
Figure 9:
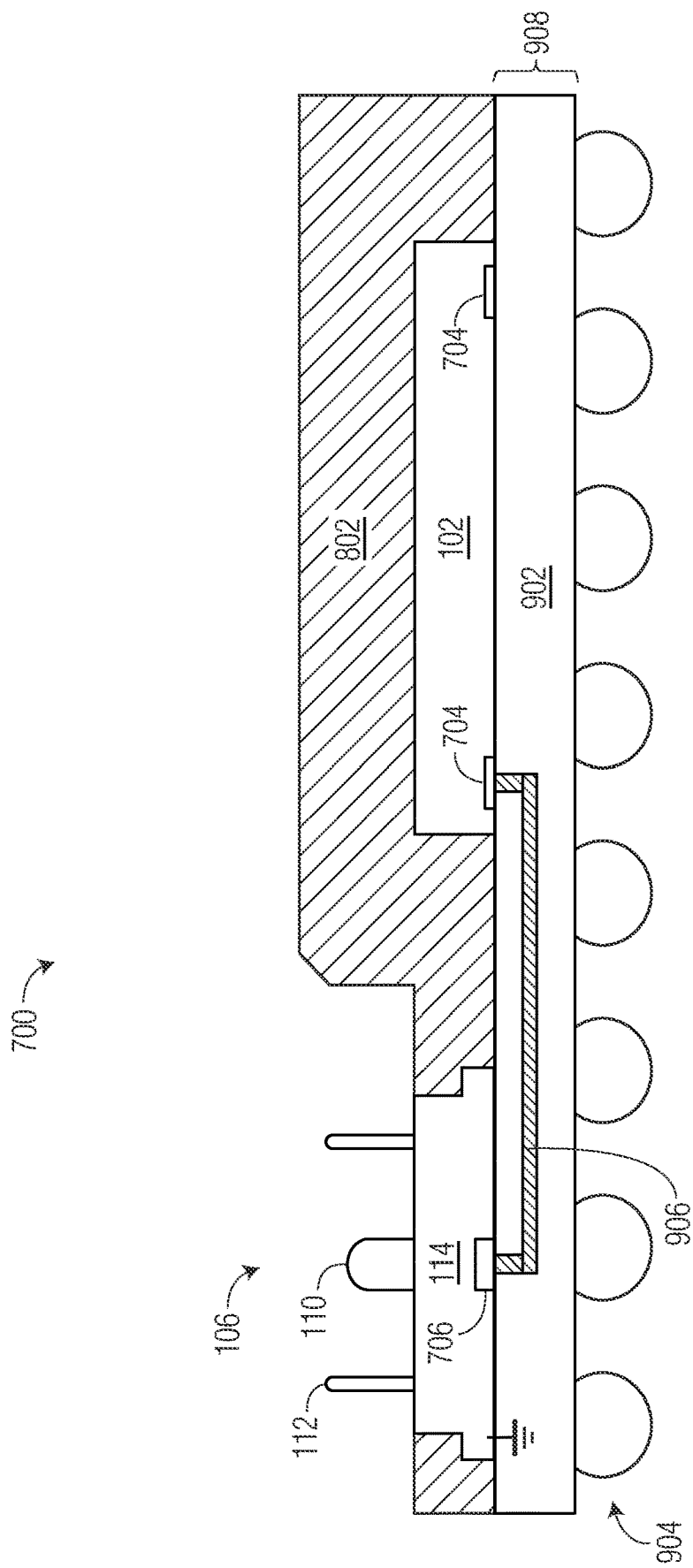

FIG. 7 illustrates, in a simplified cross-sectional view, another alternative example semiconductor device 700 at a stage of manufacture in accordance with an embodiment. The stages of manufacture depicted in FIG. 7 through FIG. 9 are alternatives to the stages of manufacture depicted in FIG. 2 and FIG. 3. At this stage, the semiconductor device 700 includes the semiconductor die 102 and the connector structure 106 placed on a carrier substrate 702. The carrier substrate 702 is configured to provide a temporary structure for placement of the semiconductor die 102 and the connector structure 106 during encapsulation at a subsequent stage of manufacture, for example.

FIG. 8 illustrates, in a simplified cross-sectional view, the alternative example semiconductor device 700 at a subsequent stage of manufacture in accordance with an embodiment. At this stage, the semiconductor device 700 includes the semiconductor die 102 and the connector structure 106 at least partially encapsulated with an encapsulant 802 while on the carrier substrate 702. In this embodiment, the semiconductor die 102 and base portion of the connector structure 106 is over-molded with the encapsulant 802 (e.g., epoxy molding compound) by way of a molding process such as FAM. In this embodiment, the encapsulant 802 is in direct contact with outer sidewalls of the connector base 114. In this embodiment, the encapsulant 104 overlaps a flange 708 of the connector base 114 to enhance structural stability and reinforcement of the connector structure 106. After encapsulating with the encapsulant 802, the carrier substrate 702 is removed at a subsequent stage leaving a bottom side of the connector structure 106 and an active side of the semiconductor die 102 exposed.

FIG. 9 illustrates, in a simplified cross-sectional view, the alternative example semiconductor device 700 at a subsequent stage of manufacture in accordance with an embodiment. At this stage, the at least partially encapsulated semiconductor die 102 and connector structure 106 are separated from the carrier substrate 702. After the carrier substrate 702 is removed, an interconnecting package substrate 908 is applied to the resulting exposed active side of the semiconductor die 102 and exposed bottom surfaces of the connector structure 106. The package substrate 908 includes conductive features (e.g., feed 906) surrounded by non-conductive material 902. The package substrate 908 may be formed as a build-up substrate or may be provided as a pre-formed substrate. Conductive feed 906 is formed in the package substrate 908 between bond pad 704 and signal terminal 706 to interconnect the semiconductor die 102 and the connector structure 106. The connector base 114 is interconnected to a ground voltage supply terminal (illustrated as a ground symbol) by way of the package substrate 908.

After the package substrate 908 is applied, conductive connectors 904 (e.g., solder balls) are affixed to a bottom surface of the package substrate 908. The conductive connectors 904 are configured and arranged to provide conductive connections between the semiconductor device 700 and a PCB, for example. The conductive connectors 904 may be in the form of any suitable conductive structures such as solder balls, gold studs, copper pillars, and the like, to connect conductive features of the semiconductor device 700 with the PCB.

Figure 10:
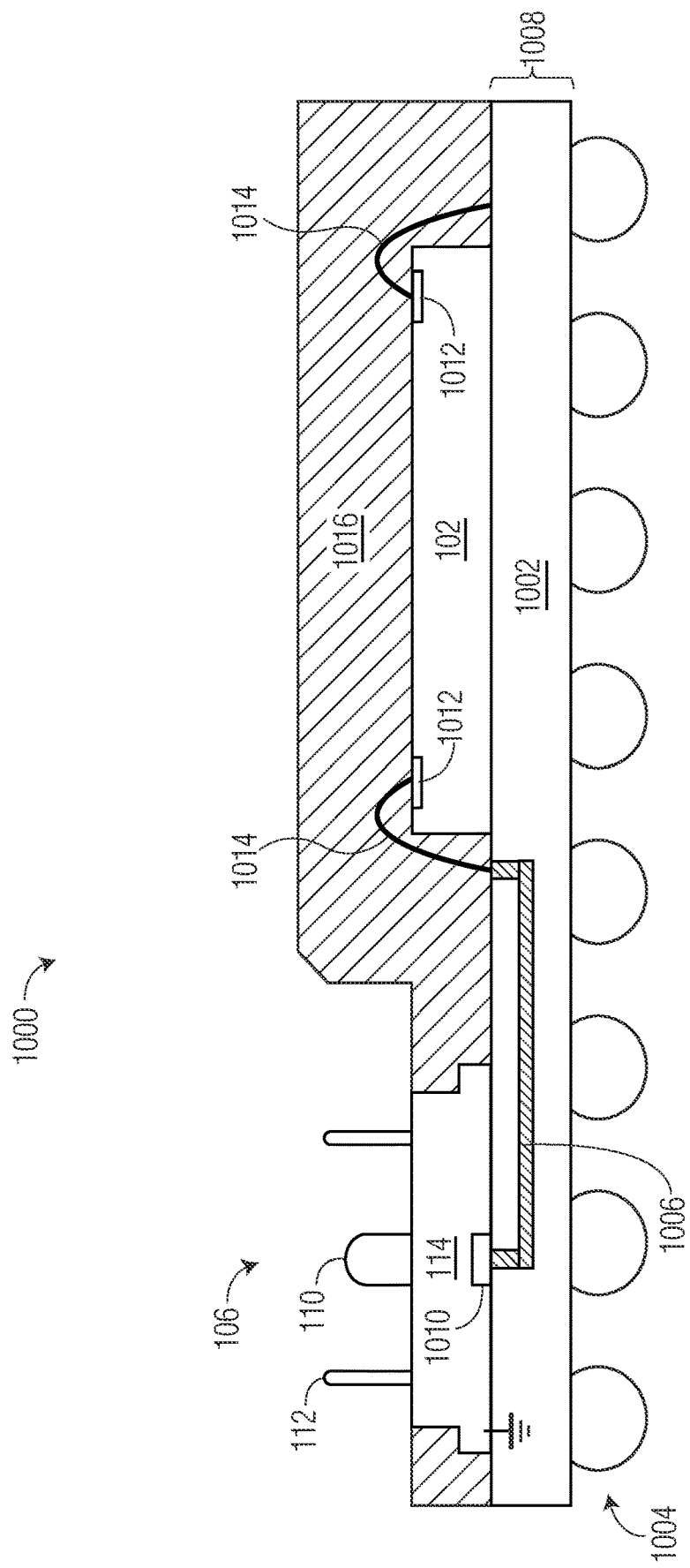
FIG. 10 illustrates, in a simplified cross-sectional view, another alternative example semiconductor device having a connector in package in accordance with an embodiment.

FIG. 10 illustrates, in a simplified cross-sectional view, another alternative example semiconductor device 1000 having a connector in package in accordance with an embodiment. The example semiconductor device 1000 depicted in FIG. 10 is an alternative to the example semiconductor device 100 depicted in FIG. 3, for example. In this embodiment, the semiconductor device 1000 includes the semiconductor die 102 in an active-side-up configuration and the connector structure 106 at least partially encapsulated with an encapsulant 1016. The backside of the semiconductor die 102 and the base 114 of the connector structure 106 are affixed on a package substrate 1008 and over-molded with the encapsulant 1016 by way of a molding process such as FAM or other suitable molding process.

The package substrate 1008 includes conductive features (e.g., metal feed 1006) surrounded by non-conductive material 1002. Bond pads 1012 of the semiconductor die 102 are interconnected with conductive features (e.g., feed 1006) of the package substrate 1008 by way of bond wires 1014. The conductive feed 1006 is formed in the package substrate 1008 and together with bond wire 1014 interconnects the semiconductor die 102 and the signal terminal 1010 of the connector structure 106. The ground terminal of the base 114 of the connector structure 106 is interconnected to a ground voltage supply terminal (illustrated as a ground symbol) by way of the package substrate 1008.

Conductive connectors 1004 are affixed to a bottom surface of the package substrate 1008. The conductive connectors 1004 are configured and arranged to provide conductive connections between the semiconductor device 1000 and a PCB, for example. The conductive connectors 1004 may be in the form of any suitable conductive structures such as solder balls, gold studs, copper pillars, and the like, to connect conductive features of the semiconductor device 1000 with the PCB.

Figure 11:
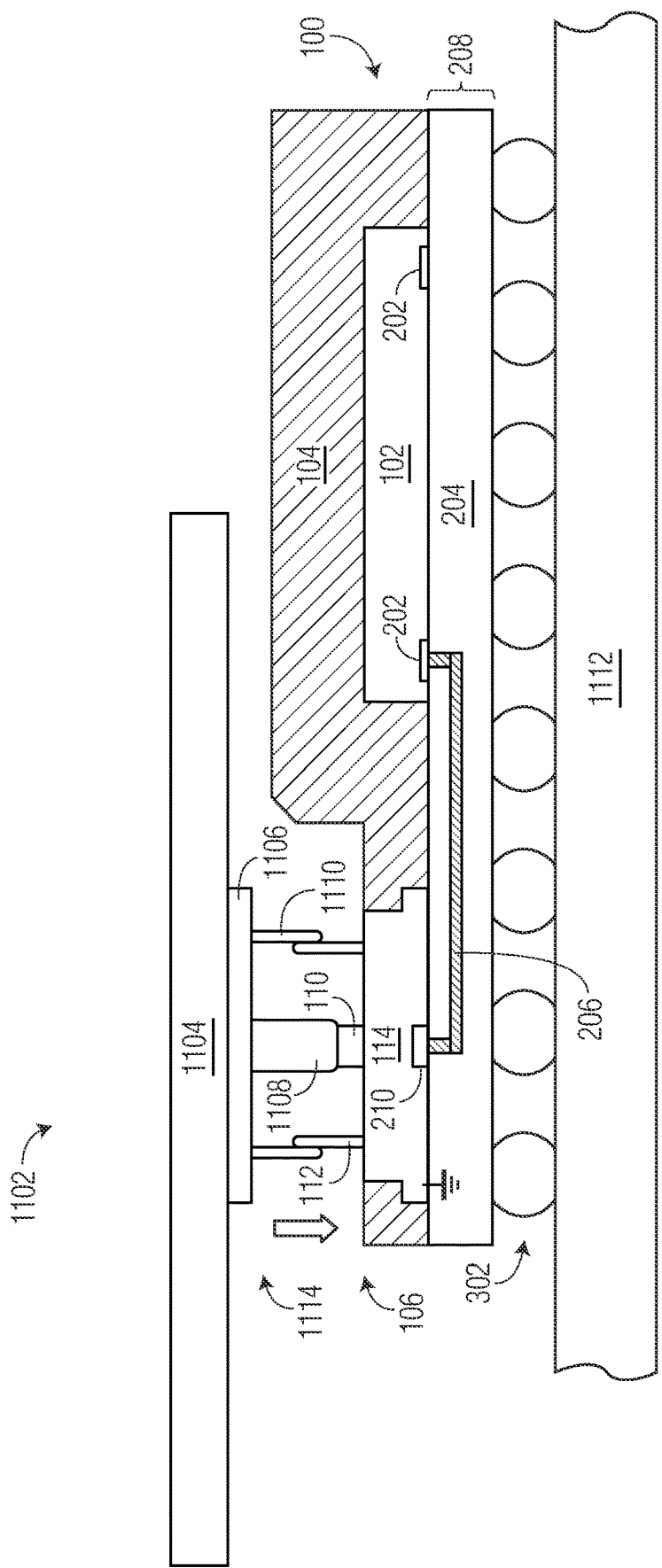
FIG. 11 illustrates, in a simplified cross-sectional view, the example semiconductor device with an antenna module connected in accordance with an embodiment.

FIG. 11 illustrates, in a simplified cross-sectional view, the example semiconductor device 100 with an example antenna module 1102 connected in accordance with an embodiment. As depicted in FIG. 11, the semiconductor device 100 is affixed to a PCB 1112 and the antenna module 1102 is connected to the semiconductor device 100 by way of the connector structure 106 and mating connector 1114.

In this embodiment, the antenna module 1102 includes the mating connector 1114 attached or otherwise integrated with an antenna substrate 1104. The mating connector 1114 includes a base portion 1106, a conductive signal member 1108, and a conductive shield member 1110 connected to the base. The signal member 1108 is electrically isolated from the base 1106 and shield member 1110. The shield member 1110 substantially surrounds the signal member 1108, thus, the mating connector 1114 may be characterized as a coaxial mating connector. The antenna substrate 1104 includes conductive traces interconnected with the signal member 1108 and antenna features not shown for illustration purposes.

Figure 12:
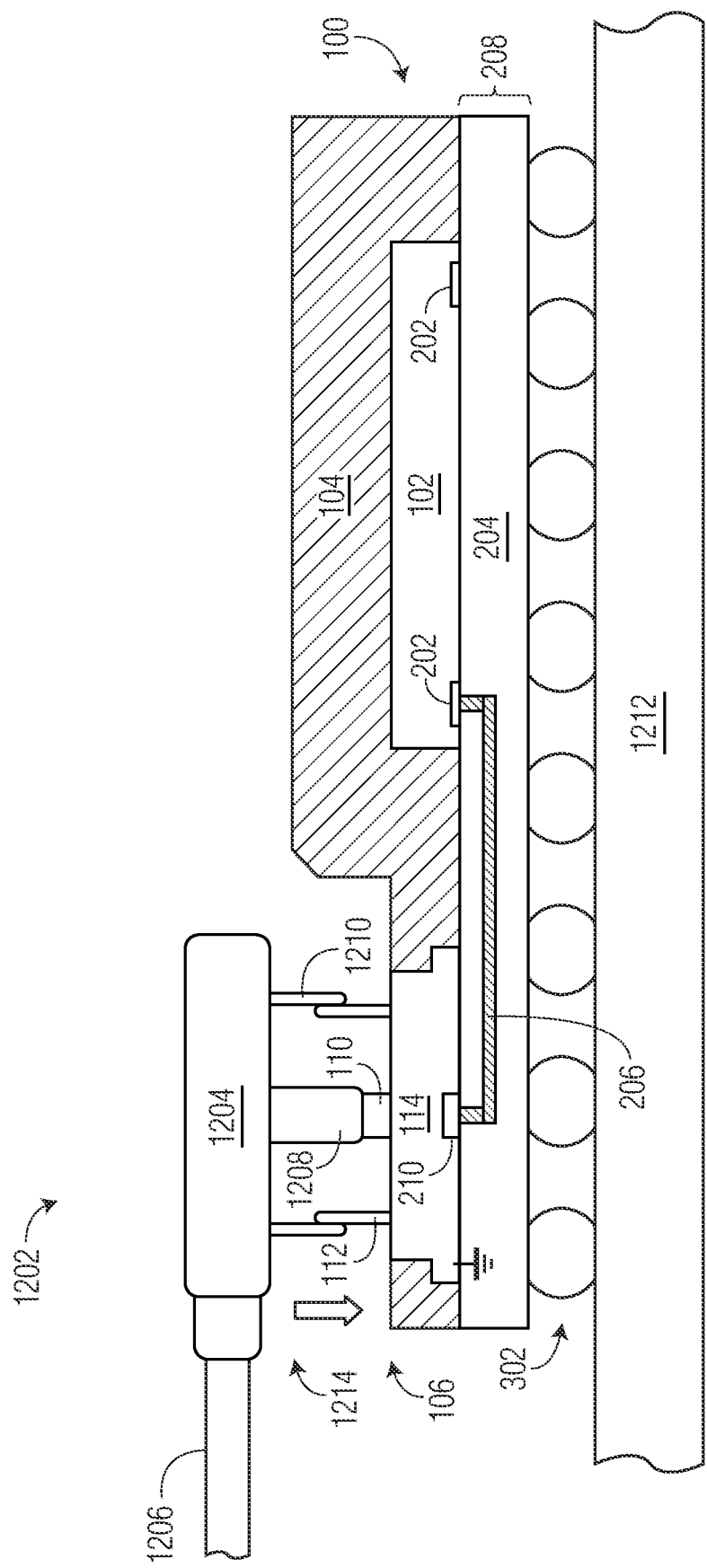
FIG. 12 illustrates, in a simplified cross-sectional view, the example semiconductor device with an external cable connected in accordance with an embodiment.

FIG. 12 illustrates, in a simplified cross-sectional view, the example semiconductor device 100 with an example external cable assembly 1202 connected in accordance with an embodiment. As depicted in FIG. 12, the semiconductor device 100 is affixed to a PCB 1212 and the external cable assembly 1202 is connected to the semiconductor device 100 by way of the connector structure 106 and mating connector 1214.

In this embodiment, the external cable assembly 1202 includes the mating connector 1214 attached or otherwise integrated in a mating connector housing 1204 and a signal cable 1206. The mating connector 1214 includes a conductive signal member 1208 conductively connected to the signal cable 1206, and a conductive shield member 1210 conductively connected to the connector housing 1204. The signal member 1208 is electrically isolated from the housing 1204 and shield member 1210. The shield member 1210 substantially surrounds the signal member 1208, thus, the mating connector 1214 may be characterized as a coaxial mating connector. The cable assembly 1202 may be connected by way of the signal cable 1206 to an external antenna or other accessory (e.g., external speaker, microphone, sensor) not shown for illustration purposes.

Generally, there is provided, a method of manufacturing a semiconductor device including providing a connector structure configured for carrying a signal; providing a semiconductor die; encapsulating with an encapsulant at least a portion of the connector structure and the semiconductor die; and interconnecting the semiconductor die with the connector structure by way of a conductive trace. The connector structure may be characterized as a coaxial connector having a signal member substantially surrounded by a conductive shield member. The encapsulating with the encapsulant may include encapsulating at least a portion of the connector structure in a molding step different from that of the semiconductor die. The interconnecting the semiconductor die with the connector structure by way of the conductive trace may include forming a conductive connection from a bond pad of the semiconductor die to a signal terminal of the connector structure. The method may further include affixing the connector structure and the semiconductor die on a package substrate before encapsulating with the encapsulant. The conductive trace interconnecting the semiconductor die with the connector structure may be formed at least in part in the package substrate. The connector structure may be further configured for attachment of a radio frequency antenna. The connector structure may be further configured for carrying a radio frequency signal having a frequency in a frequency range characterized as an ultra-wideband (UWB) frequency range. The method may further include placing the connector structure and the semiconductor die on a carrier substrate before encapsulating with the encapsulant.

In another embodiment, there is provided, a semiconductor device including a connector structure configured for carrying a signal; a semiconductor die having a bond pad interconnected to the connector structure by way of a conductive trace; and an encapsulant encapsulating at least a portion of the connector structure and the semiconductor die. The connector structure may be characterized as a coaxial connector having a signal member substantially surrounded by a conductive shield member. The semiconductor device may further include a package substrate, the connector structure and the semiconductor die affixed on the package substrate. The conductive trace may be at least in part embedded in the package substrate. The connector structure may be further configured for attachment of an RF antenna. The connector structure may be further configured for carrying a radio frequency (RF) signal having a frequency in a frequency range characterized as an ultra-wideband (UWB) frequency range.

In yet another embodiment, there is provided, a semiconductor device including a connector structure configured for carrying a radio frequency (RF) signal, the RF signal having a frequency in an ultra-wideband (UWB) frequency range; a semiconductor die having a bond pad interconnected to a signal terminal of the connector structure by way of a conductive trace; and an encapsulant encapsulating at least a portion of the connector structure and the semiconductor die. The connector structure may be characterized as a coaxial connector having a signal member substantially surrounded by a conductive shield member, the signal member connected to the signal terminal. The semiconductor device may further include a package substrate, the conductive trace at least in part embedded in the package substrate. The connector structure may be further configured for attachment of an RF antenna or an external cable. The encapsulant encapsulating at least the portion of the connector structure may be formed in a molding step different from that of the semiconductor die.

By now, it should be appreciated that there has been provided a semiconductor device having a connector in package. The semiconductor device includes a semiconductor die and one or more connector structures at least partially encapsulated with an encapsulant. Each of the one or more connector structures includes a signal member exposed through the encapsulant and configured for connection with a mating connector. An external antenna module or other accessories having corresponding mating connector(s) may be electrically connected to the semiconductor device by way of the one or more connector structures. By connecting an external antenna module in this manner, for example, the antenna can be formed in any size, shape, and orientation without impacting the physical dimensions and location of the semiconductor device.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of manufacturing a semiconductor device, the method comprising:
   providing a connector structure configured for carrying a signal, the connector structure characterized as a coaxial connector having a signal member substantially surrounded by a conductive shield member;
   providing a semiconductor die;
   encapsulating with an encapsulant at least a portion of the connector structure and the semiconductor die; and
   interconnecting the semiconductor die with the connector structure by way of a conductive trace.

2. The method of claim 1, wherein the encapsulating with the encapsulant comprises encapsulating at least a portion of the connector structure in a molding step different from that of the semiconductor die.

3. The method of claim 1, wherein the interconnecting the semiconductor die with the connector structure by way of the conductive trace includes forming a conductive connection from a bond pad of the semiconductor die to a signal terminal of the connector structure.

4. The method of claim 1, further comprising affixing the connector structure and the semiconductor die on a package substrate before encapsulating with the encapsulant.

5. The method of claim 4, wherein the conductive trace interconnecting the semiconductor die with the connector structure is formed at least in part in the package substrate.

6. The method of claim 1, wherein the connector structure is further configured for attachment of a radio frequency antenna.

7. The method of claim 1, wherein the connector structure is further configured for carrying a radio frequency signal having a frequency in a frequency range characterized as an ultra-wideband (UWB) frequency range.

8. The method of claim 1, further comprising placing the connector structure and the semiconductor die on a carrier substrate before encapsulating with the encapsulant.

9. A semiconductor device comprising:
   a connector structure configured for carrying a signal, the connector structure is characterized as a coaxial connector having a signal member substantially surrounded by a conductive shield member;
   a semiconductor die having a bond pad interconnected to the connector structure by way of a conductive trace; and an encapsulant encapsulating at least a portion of the connector structure and the semiconductor die.

10. The semiconductor device of claim 9, further comprising a package substrate, the connector structure and the semiconductor die affixed on the package substrate.

11. The semiconductor device of claim 10, wherein the conductive trace is at least in part embedded in the package substrate.

12. The semiconductor device of claim 9, wherein the connector structure is further configured for attachment of an RF antenna.

13. The semiconductor device of claim 9, wherein the connector structure is further configured for carrying a radio frequency (RF) signal having a frequency in a frequency range characterized as an ultra-wideband (UWB) frequency range.

14. A semiconductor device comprising:
  a connector structure configured for carrying a radio frequency (RF) signal, the RF signal having a frequency in an ultra-wideband (UWB) frequency range, the connector structure characterized as a coaxial connector having a signal member substantially surrounded by a conductive shield member, the signal member connected to the signal terminal;
  a semiconductor die having a bond pad interconnected to a signal terminal of the connector structure by way of a conductive trace; and
  an encapsulant encapsulating at least a portion of the connector structure and the semiconductor die.

15. The semiconductor device of claim 14, further comprising a package substrate, the conductive trace at least in part embedded in the package substrate.

16. The semiconductor device of claim 14, wherein the connector structure is further configured for attachment of an RF antenna or an external cable.

17. The semiconductor device of claim 14, wherein the encapsulant encapsulating at least the portion of the connector structure is formed in a molding step different from that of the semiconductor die.

* * * * *